(12) United States Patent
Ouellet et al.

(10) Patent No.: US 6,268,620 B1
(45) Date of Patent: Jul. 31, 2001

(54) METHOD OF FORMING CAPACITORS ON INTEGRATED CIRCUIT

(75) Inventors: Luc Ouellet, Granby; Yves Tremblay, Bromont, both of (CA)

(73) Assignee: Mitel Corporation, Kanata (CA)

( * ) Notice: Subject to any disclaimer, the term of this patent is extended or adjusted under 35 U.S.C. 154(b) by 0 days.

(21) Appl. No.: 09/236,101

(22) Filed: Jan. 25, 1999

(30) Foreign Application Priority Data

Jan. 23, 1998 (GB) .................................................. 9801322

(51) Int. Cl.[7] .................................................. H01L 29/72
(52) U.S. Cl. .......................... 257/301; 257/303; 257/306; 257/532; 438/386; 438/648; 438/656; 438/685; 438/703
(58) Field of Search ..................................... 257/301, 303, 257/306, 532; 438/386, 703, 648, 656, 685

(56) References Cited

U.S. PATENT DOCUMENTS 5,172,201 * 12/1992 Suizu .................................... 257/532
5,189,503 * 2/1993 Suguro et al. ........................ 257/532
5,290,609 3/1994 Horiiki et al. ........................ 427/576
5,889,300 * 3/1999 Figura et al. ........................ 257/532

FOREIGN PATENT DOCUMENTS 0188946  7/1986 (EP) .

* cited by examiner

*Primary Examiner*—Edward Wojciechowicz
(74) *Attorney, Agent, or Firm*—Marks & Clerk

(57) ABSTRACT

A method of making a semiconductor device, comprises the steps of providing an insulating layer, forming a series of holes in the insulating layer, depositing a first layer of a metal, or a compound thereof, on the insulating layer such and in the holes, forming a dielectric layer on the first layer, the dielectric consisting of a compound of the metal, and forming a second layer of the metal, or a compound thereof, on the dielectric layer. The first, second and dielectric layers form a conformal capacitive sandwich structure extending into the holes.

18 Claims, 2 Drawing Sheets

METHOD OF FORMING CAPACITORS ON INTEGRATED CIRCUIT

FIELD OF THE INVENTION

This invention relates to semiconductor devices, and more particularly to a method of fabricating a capacitor on a semiconductor device.

BACKGROUND OF THE INVENTION

Capacitors are used as part of integrated circuits as analog components or, for example, as memory cells in digital circuits. It is well known from basic physics that for a capacitor the capacitance is proportional to the product of the area of the electrodes and the dielectric constant $\epsilon$, and inversely proportional to the thickness t of the dielectric. With increasing reduction in scale of semiconductor devices, the minimum physical size of the capacitors required to provide the necessary capacitance becomes a limiting factor.

It has been proposed to increase the size of the electrodes by varying their shape. It has also been proposed to increase the dielectric constant of the dielectric material. Typically, silicon dioxide is used as the dielectric, and this has been replaced by tantalum oxide ($Ta_2O_5$), which is actually known to have a high dielectric constant. The formation of a tantalum oxide dielectric is a complicated process involving multiple steps and tool changes.

An object of the invention is to provide a simple process for producing small dimension, high capacitance capacitors on semiconductor devices.

SUMMARY OF THE INVENTION

Accordingly, the present invention provides a method of making a semiconductor device, comprising the steps of providing an insulating layer; forming a series of holes in said insulating layer; depositing a first conductive layer of a metal, or a compound thereof, over said insulating layer such that said first conductive layer covers an upper surface of said insulating layer and lines said holes formed therein; forming a dielectric layer over said first layer, said dielectric consisting of a compound of said metal; and forming a second conductive layer of said metal, or a compound thereof, over said dielectric layer; whereby said first, second and dielectric layers form a conformal capacitive sandwich structure extending into said holes.

In a preferred embodiment, the metal is titanium, and the first and second layers are made of titanium nitride (TiN). The dielectric layer is titanium oxide ($TiO_2$), which has a dielectric constant approximately 9 times greater than the dielectric constant of silicon dioxide. The invention can also be implemented with other metals, for example, tantalum, which has an oxide ($Ta_2O_5$) with a high dielectric constant. If other metals are employed, it may be necessary to include additional intermediate layers. For example, it is possible to make a tantalum/tantalum nitride/tantalum oxide/tantalum nitride/tantalum structure. Tantalum nitride has too low a conductivity to be used as an electrode, but it can serve as an interface between tantalum and tantalum oxide.

The holes can be formed using conventional anisotopic etch techniques. In order to reduce the electric field strength at the edges of the holes, which would arise due to the point effect, the substrate is subjected to an isotopic etch or sputter cleaning prior to deposition of the layers forming the capacitor.

The three layers are preferably deposited in the same reactive sputtering chamber using a non-oxidized titanium target with a collimator. A collimator is a honeycomb structure that directs the titanium flux from the sputtering target in the vertical direction onto the workpiece. This ensures that the layers have an even thickness on the top surface of the substrate and in the holes.

Another advantage of a collimator is that the titanium flux between the target and the collimator is many times greater than the flux between the collimator and the workpiece. As a result, it is possible to deposit titanium oxide on the substrate without oxidizing the target. The oxidation occurs on the surface of the substrate and most other surfaces under the collimator. As a result an even layer thickness can be attained.

The anisotropic etching typically takes place in a separate tool. The substrate is then transferred to a second tool to form the bevel on the edges of the holes. It is then transferred to a different chamber in the same tool where the sputter deposition of the three layers takes place. Firstly, titanium nitride (TiN) is deposited in the presence of nitrogen gas. Then, in order to deposit the dielectric layer, it is merely necessary to change the reactive gas to oxygen, and finally the gas is changed back again to nitrogen in order to form the upper conductive layer. The sputtering is typically carried in the presence of argon.

The invention also provides a semiconductor device comprising an insulating layer having a plurality of holes formed therein; a first conductive layer of a metal, or a compound thereof, formed over said insulating layer and lining said holes formed therein; a dielectric layer formed on said first layer, said dielectric consisting of a compound of said metal; and a second conductive layer of said metal, or a compound thereof, formed over said dielectric layer; whereby said first, second and dielectric layers form a conformal capacitive sandwich structure extending into said holes.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
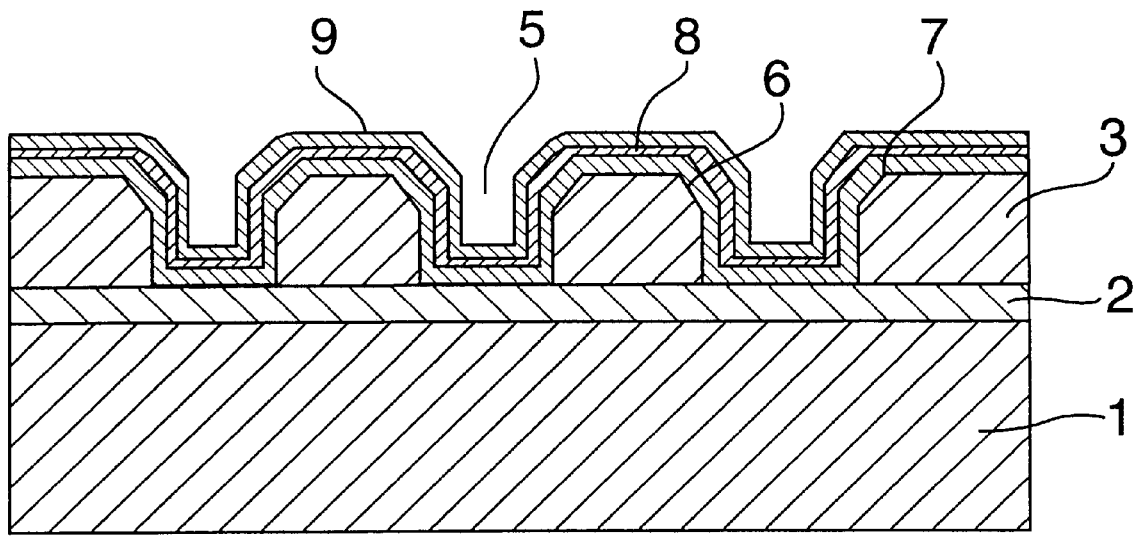
FIG. 1 is a schematic cross-sectional view of a capacitor formed in accordance with the principles of the invention.
Figure 2:
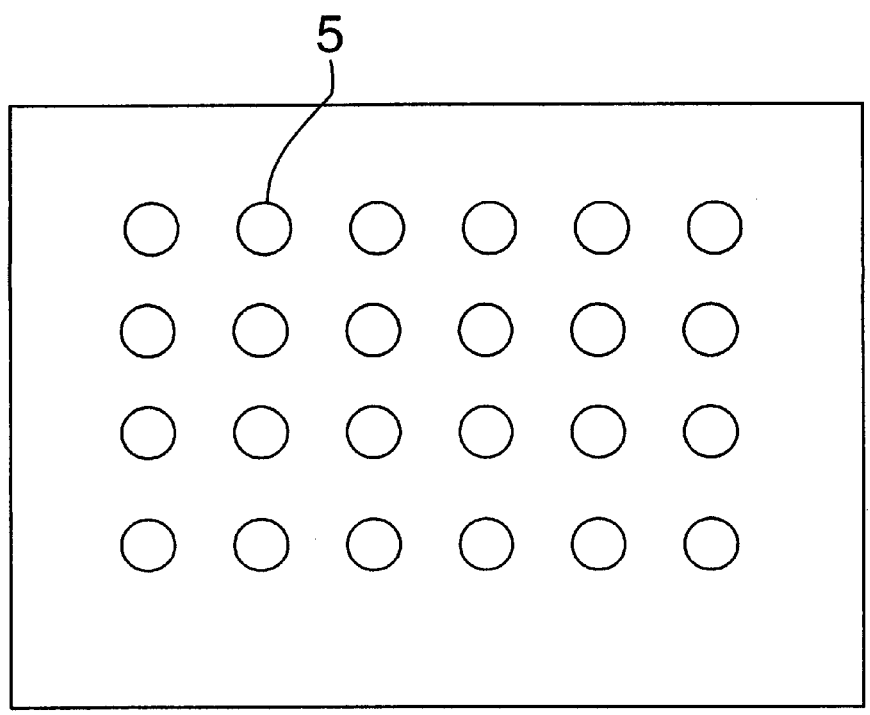
FIG. 2 is a perspective view of the capacitor shown in FIG. 1.

Referring now to FIG. 1, a substrate 1 includes an integrated circuit having an analog portion including a capacitive component. In order to form the capacitive component, a base electrode 2 is formed on the substrate 1. The base electrode 2 can be a metal electrode, or for example, it can be made of polysilicon (poly), which would be typically used if the capacitor is formed directly onto an active component of the integrated circuit. Alternatively, it could be formed of aluminum, titanium or titanium nitride.

Next, a silicon dioxide layer insulating 3, typically 0.8 microns thick, is deposited on the base electrode 2. This provides the workpiece for further processing in accordance with the invention.

The insulating layer 3 can also be a composite layer consisting of a silicate glass layer (SG), a spin-on-glass layer (SOG) and a phosphorus-doped silicate glass layer (PSG).

The workpiece is placed in a an anisotropic etching chamber to drill an array of holes 5 extending through the layer 3 to the base electrode 2. The holes 5 are typically in a uniform array, spaced 0.8 microns apart, but this is not necessary.

The workpiece is then moved to a separate tool, where it is placed in a sputter cleaning chamber, or alternatively an isotopic etching chamber. Here, the corners 6 of the holes are bevelled. The purpose of this is to reduce the electric field at the corners due to the point effect.

After the formation of the bevelled corners 6, the substrate is moved to a sputtering chamber with a titanium target for the deposition of the three layers forming the capacitor. The sputtering chamber has a collimator, in a manner known per se, below the sputtering target in order to provide a vertical flux of sputtered atoms.

Firstly, nitrogen gas is admitted into the sputtering chamber and a layer of titanium nitride (TiN) is sputtered evenly onto the surface of the insulating layer 3 to form a first conductive layer 7, which forms one electrode of the capacitor. The collimator in the sputtering chamber allows a uniform layer 7 to be formed, which is of relatively constant thickness on the top surface of the substrate and over the walls and bottom of the holes. When the desired layer thickness, typically 0.01 to 0.1 microns, has been deposited, the reactive gas in the sputtering chamber is replaced by oxygen. A further in-situ sputtering step takes place to deposit a layer 8 of titanium oxide ($TiO_2$) onto the first electrode layer 7. This layer 8 typically has a thickness of 50 to 1000 Angstroms. Care is also taken to ensure that the layer 8 has a uniform thickness. The use of a collimator allows this.

When the layer 8 has been deposited, the reactive gas is again replaced by nitrogen, and a further titanium nitride (TiN) layer 9, also of uniform thickness and typically having a thickness in the order of 0.01 to 0.1 microns, is deposited on top of the layer 8.

The result is a three-layer conformal sandwich structure consisting of two outer TiN electrode layers 7 and 9, and a inner dielectric layer 8, of titanium dioxide. The undulating nature of this sandwich structure provides a large surface area for a small physical size. The thickness of the layer 8 can be kept to a minimum consistent with breakdown requirements, and the very high dielectric constant of titanium dioxide results in a capacitor having a very high capacitance for a small physical dimension.

Figure 3:
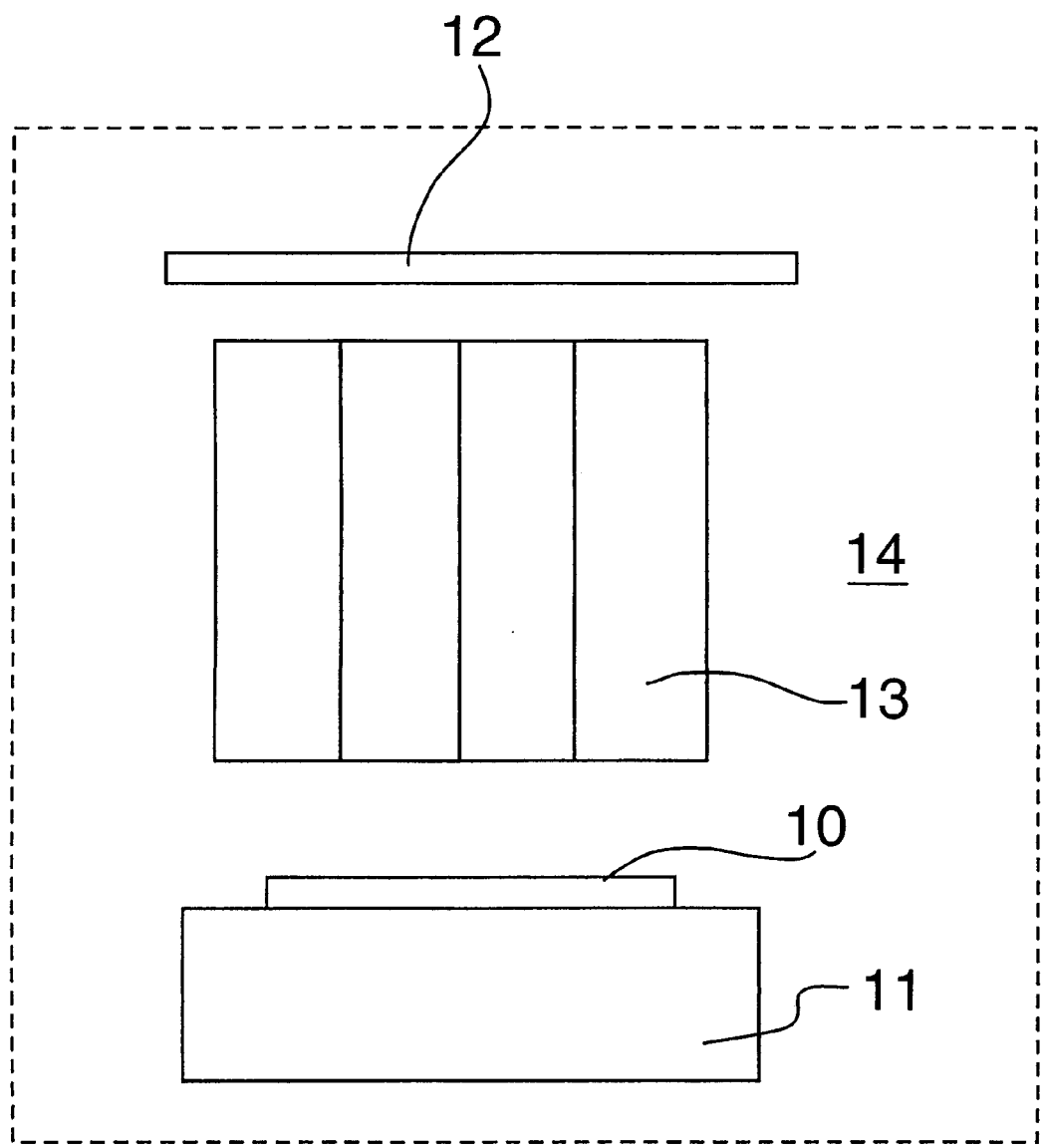
FIG. 3 is a diagrammatic view of a sputter target with collimator.

The capacitor layers should be deposited in a collimated sputter chamber as shown in FIG. 3. The semiconductor wafer 10 is mounted on a support 11 below a sputter target 12. Collimator 13, which consists of a honeycomb structure, ensures that the flux from the target 12 is vertical. Another effect of the collimator 13 is that the titanium flux below the honeycomb is only about 20% of the flux between the collimator and the target 12. The partial pressure of the reactive gas is about the same above and below the collimator. The high titanium flux above the collimator prevents the target from being poisoned by the reactive gas, which means that a pure titanium target can employed. This results in a more uniform deposited layer.

Because the electrodes have a metallic behavior (typically in the prior art they are formed of polysilicon), the resulting capacitor also has a good voltage coefficient. The outer electrode layer could be made of titanium, rather than titanium nitride, although titanium nitride is the preferred embodiment. Also, other metals could be employed, the main requirement being that the metal has one compound that is electrically conductive and another compound that has a high dielectric constant. For example, tantalum can be employed. Although not generally considered a conductor, tantalum nitride has a low resisitivity. Tantalum oxide is a good dielectric. If tantalum is employed, the electrodes are formed of a tantalum/tantalum nitride double layer, so that the resulting capacitor consists of tantalum/tantalum nitride/tantalum oxide/tantalum nitride/tantalum layered structure. The tantalum nitride has too high a resistance to be used as an electrode, but can serve as an interface between the tantalum oxide and the tantalum. The tantalum cannot be placed in direct contact with the tantalum oxide because of its tendency to reduce it.

A similar structure could of course be employed with titanium, although since titanium nitride is a good conductor, it is not necessary to employ a double titanium/titanium nitride layer as the electrode.

The invention has the major advantage that the capacitor is of small size and high capacitance. It can permit a fifty-fold improvement in size for a given capacitance an thus permit a substantial increase in packing density of integrated circuits to be achieved. It can be fabricated in a series of simple process steps without the need to move it from one chamber to another. It is merely necessary to change the reactive gas in the sputtering chamber to change the nature of the deposited layers form conductive to non-conductive and vice versa.

We claim:

1. A method or making a semiconductor device, comprising the steps of:
   providing a substrate;
   forming an insulating layer on said substrate;
   forming a series of holes in said insulating layer;
   placing said substrate in a sputtering chamber;
   sputtering a first conductive layer of a metal, or a compound thereof, over said insulating layer such that said first conductive layer covers an upper surface of said insulating layer and lines said holes formed therein;
   sputtering a dielectric layer over said first layer in said sputtering chamber, said dielectric consisting of a compound of said metal and being formed by the introduction of a reactive gas into said sputtering chamber to react with said metal to form said compound; and
   sputtering a second conductive layer of said metal, or a compound thereof, over said dielectric layer in said sputtering chamber;
   whereby said first, second and dielectric layers form a conformal capacitive sandwich structure extending into said holes.

2. A method as claimed in claim 1, further comprising the steps of forming a base conductive layer on said substrate, and forming said insulating layer over said base conductive layer, said holes extending through said insulating layer to said base conductive layer.

3. A method as claimed in claim 2, wherein said base conductive layer is made of aluminum or polysilicon.

4. A method as claimed in claim 1 wherein said metal is titanium.

5. A method as claimed in claim 4 wherein said dielectric is made of titanium dioxide.

6. A method as claimed in claim 5 wherein said first and third layers are made of titanium nitride.

7. A method as claimed in claim 6, wherein said first, second and third layers are made by sputtering in the presence of a reactive gas.

8. A method as claimed in claim 7, wherein said reactive gas is sequentially changed from nitrogen to oxygen and back to nitrogen to form the three layers.

9. A method as claimed in claim 1, wherein said sputtering chamber includes a collimator between a target and said substrate to ensure an even deposition of said layers.

10. A method as claimed in claim 1, wherein said insulating layer is a composite layer.

11. A method as claimed in claim 10, wherein said composite layer includes a spin-on glass intermediate layer.

12. A method as claim in claim 11, wherein said composite layer comprises a silicate glass layer, a phosphorus-doped glass layer and a spin-on glass layer.

13. A semiconductor device comprising:
   a) an insulating layer having a plurality of holes formed therein;
   b) a first conductive layer of titanium nitride formed over said insulating layer and lining said holes formed therein;
   c) a dielectric layer formed on said first layer, said dielectric consisting of titanium dioxide; and
   d) a second conductive layer of titanium or titanium nitride formed over said dielectric layer;
   whereby said first, second and dielectric layers form a conformal capacitive sandwich structure extending into said holes.

14. A semiconductor device as claimed in claim 13, wherein said second conductive layer is titanium nitride.

15. A semiconductor device as claimed in claim 13 wherein said holes form a uniform array.

16. A semiconductor device as claimed in claim 13, further comprising a substrate and a base conductive layer formed over said substrate, said first conductive layer contacting said base conductive layer in said holes.

17. A semiconductor device as claimed in claim 13, which is a hybrid device including an analog portion and a digital portion, said structure forming part of said analog portion.

18. A method as claimed in claim 9, wherein said collimator is in the form of a honeycomb.

* * * * *